(12) United States Patent
Chen et al.

(10) Patent No.: US 12,205,980 B2
(45) Date of Patent: Jan. 21, 2025

(54) SEMICONDUCTOR DEVICE HAVING A RESISTOR

(71) Applicant: Taiwan Semiconductor Manufacturing Company, Ltd., Hsinchu (TW)

(72) Inventors: Liang-Hsiang Chen, Taichung (TW); Chinyu Su, Taichung (TW); Che-Chih Hsu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 425 days.

(21) Appl. No.: 17/750,185

(22) Filed: May 20, 2022

(65) Prior Publication Data

US 2023/0378244 A1  Nov. 23, 2023

(51) Int. Cl.
*H01L 49/02* (2006.01)

(52) U.S. Cl.
CPC .................................. *H01L 28/20* (2013.01)

(58) Field of Classification Search
CPC ........................ H01L 28/20; H01L 27/0629
See application file for complete search history.

(56) References Cited

U.S. PATENT DOCUMENTS

| 2015/0004779 | A1  | 1/2015 | Zhu et al. |
| 2015/0126015 | A1* | 5/2015 | Chen ............... H01L 27/0629 438/382 |
| 2016/0020148 | A1* | 1/2016 | Song ............... H01L 23/5228 438/238 |
| 2016/0204100 | A1* | 7/2016 | Zhang ............. H01L 29/66795 438/210 |

OTHER PUBLICATIONS

The office action received in the corresponding Taiwan Application 112107313, mailed Aug. 23, 2023, 5 pages.

* cited by examiner

*Primary Examiner* — John A Bodnar
(74) *Attorney, Agent, or Firm* — Kilpatrick Townsend & Stockton LLP

(57) ABSTRACT

A method of forming a semiconductor device is disclosed. The method includes forming a plurality of isolation regions on a semiconductor substrate, forming a protective layer in a resistor region of the semiconductor substrate, after forming the protective layer, etching a gate dielectric layer to form first and second gate dielectric layers of a transistor in a transistor region of the semiconductor substrate, removing the protective layer, forming first and second dummy gate stacks over the first and second gate dielectric layers, respectively, forming a resistor in the resistor region, forming third and fourth dummy gate stacks over the resistor, and replacing each of the first, second, third, and fourth dummy gate stacks with a conductive material.

20 Claims, 9 Drawing Sheets

SEMICONDUCTOR DEVICE HAVING A RESISTOR

TECHNICAL FIELD

The subject matter described herein relates to thin film resistors, and more particularly to thin film resistors formed over a shallow trench isolation region.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

Thin film resistors may be formed over shallow trench isolation regions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1A:
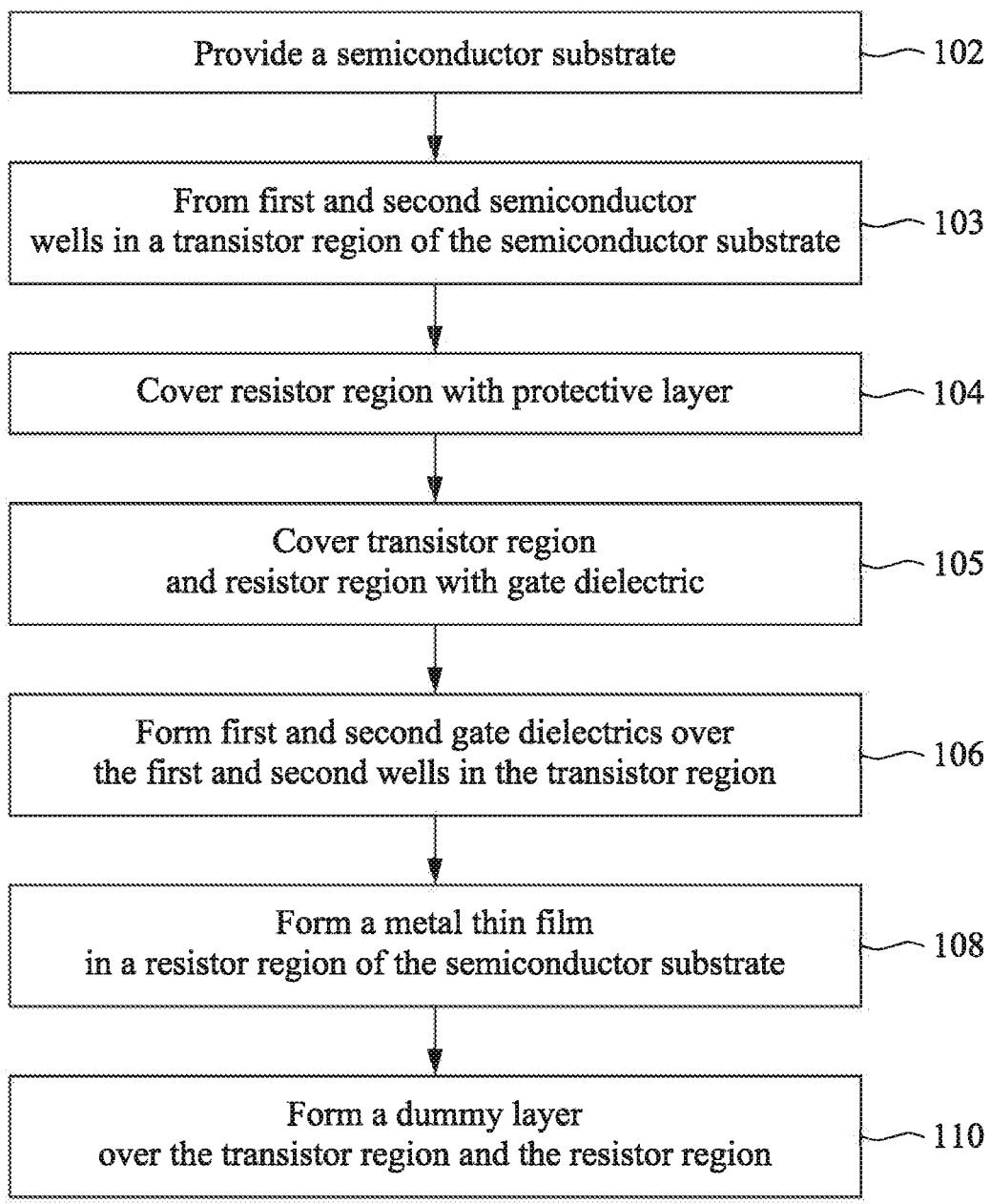
FIGS. 1A, 1B and 1C illustrate a flow chart of an exemplary method for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

The present disclosure provides various embodiments of a semiconductor device including a thin film resistor. In some embodiments, the disclosed thin film resistor includes a metal thin film disposed above a shallow trench isolation (STI) region of a semiconductor substrate, and two contact structures located on respective ends of the metal thin film, wherein the STI region is covered with a protective layer during certain steps of the formation of transistors on the semiconductor substrate. As such, the STI layer is not overetched. In contrast, thin film resistors formed with the STI layer overetched may be formed without proper electrical connection to other circuits. As a result, manufacturing yield loss due to malformed or unformed electrical connections are significantly decreased because of the process features discussed herein.

Further, in some embodiments, the disclosed thin film resistor is formed in a resistor region on the semiconductor substrate, and on the other hand, in a transistor region on the semiconductor substrate, one or more metal-oxide-semiconductor field-effect transistors (MOSFETs) may be formed concurrently with the thin film resistor. In particular, in some embodiments, the contact structures of the thin film resistor may be formed concurrently with the formation of a metal gate of a p-type MOSFET in the transistor region, and the resistor region may be filled with the resistance material concurrently with the formation of a metal gate of an n-type MOSFET in the transistor region. Accordingly, the disclosed thin film resistor can be formed using fabrication steps compatible with current complementary MOS (CMOS) fabrication technologies, and may only use at most one pattern to define the resistor region in the dummy layer.

Figure 1B:
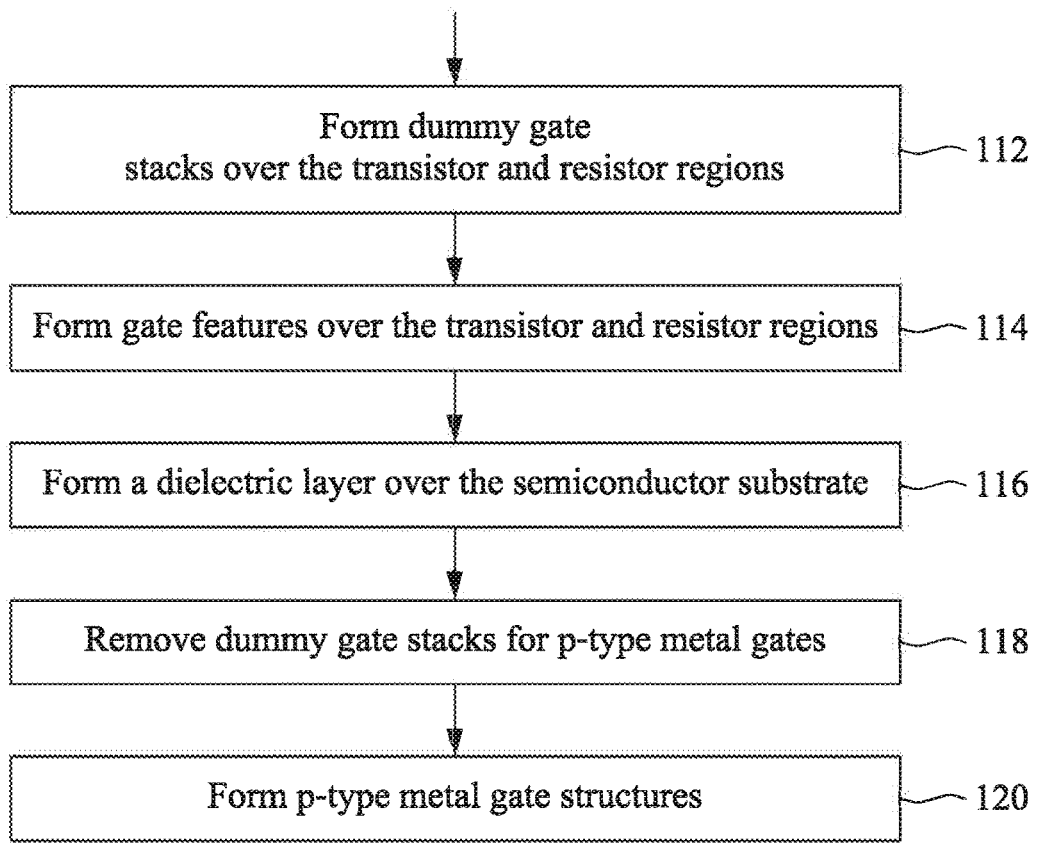
Figure 1C:
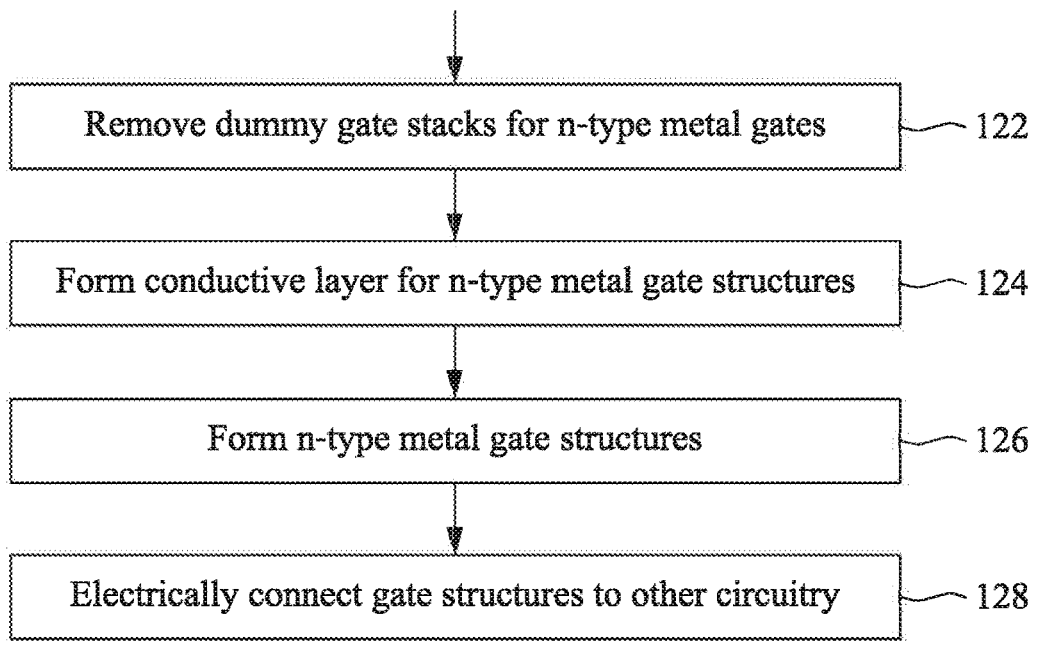

FIGS. 1A, 1B, and 1C collectively illustrate a flowchart of a method 100 to form a semiconductor device, including a thin film resistor, according to one or more embodiments of the present disclosure. It is noted that the method 100 is merely an example, and is not intended to limit the present disclosure. Accordingly, it is understood that additional operations may be provided before, during, and/or after the method 100 of FIGS. 1A-1C, and that some other operations may be omitted. It is further understood that some operations are only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, 2J, 2K, 2L, 2M, 2N, and 2O respectively, which will be discussed in further detail below.

Referring now to FIG. 1A, the method 100 starts with operation 102 in which a semiconductor substrate is provided. In some embodiments, when the semiconductor substrate is provided, a plurality of isolation features (e.g., shallow trench isolation (STI) features) may be formed over a main surface of the semiconductor substrate. Accordingly, the semiconductor substrate may be divided into at least two regions, a transistor region and a resistor region, by such a plurality of isolation features. The method 100 continues to operation 103 in which first and second semiconductor wells are respectively formed in the transistor region of the semiconductor substrate. In some embodiments, the first and second semiconductor wells, laterally spaced from each other by at least one of the plurality of isolation features, are formed with respective different doping types. For example, the first semiconductor well is doped with a first doping type (e.g., n-type); and the second semiconductor well is doped with a second doping type (e.g., p-type). The method 100 continues to operation 104 in which the resistor region is covered with a protective coating. The method 100 continues to operation 105 in which both the transistor region and the resistor region is covered with a gate oxide dielectric material. The method 100 continues to operation 106 in which first and second gate dielectric layers are formed. The method 100 continues to operation 108 in which a metal thin film is formed in the resistor region of the semiconductor substrate. The method 100 continues to operation 110 in which a dummy layer is formed over the transistor region and the resistor region. In some embodiments, the dummy layer may be formed of a polysilicon material, which is used to form respective dummy gate stacks over the first and second semiconductor regions, as will be discussed in further detail below.

Referring then to FIG. 1B, the method 100 continues to operation 112 in which dummy gate stacks are formed over the transistor and resistor regions, respectively. In some embodiments, a first dummy gate stack, including a first portion of the dummy layer and the first gate dielectric layer directly below the first portion of the dummy layer, is disposed over a middle portion of the first semiconductor region; a the second dummy gate stack, including a second portion of the dummy layer and the second gate dielectric layer directly below the second portion of the dummy layer, is disposed over a middle portion of the second semiconductor region. The method 100 continues to operation 114 in which respective source and drain features are formed within the first and second semiconductor wells. In some embodiments, within the first semiconductor well, the source and drain features are respectively formed on sides of the first dummy gate stack; and within the second semiconductor well, the source and drain features are respectively formed on sides of the second dummy gate stack. Corresponding features are formed in the resistor region on sides of the dummy gate stacks formed in the resistor region. The method 100 continues to operation 116 in which a dielectric layer is formed over the semiconductor substrate. In some embodiments, the dielectric layer may be an inter-layer dielectric (ILD) layer filling at least a first space between the first and second dummy gate stacks, a second space between at least one of the first and second dummy gate stacks and a dummy gate stack in the resistor region, and between the dummy gate stacks in the resistor region. The method 100 continues to operation 118 in which the dummy layer of the first dummy gate stack is removed to form a first gate trench in the first dummy gate stack, and the dummy layer overlaying the dummy gates in the resistor region are removed to form gate trenches for contacting the metal thin film in the resistor region. As such, the gate dielectric layer of the first dummy gate stack may be re-exposed, and portions of a top surface of the metal thin film (e.g., the portions of the top surface at the respective ends of the metal thin film) may be also re-exposed. The method 100 continues to operation 120 in which the first gate trench and the two contact holes in the resistor region are each refilled with a first conductive layer to form a p-type metal gate structures. In some embodiments, the first conductive layer (i.e., the p-type metal gate) may include two or more gate material layers stacked on top of one another, for example, a p-type work function layer, which is typically referred to as a p-metal, and one or more other conductive layers.

Referring then to FIG. 1C, the method 100 continues to operation 122 in which the dummy layer of the second dummy gate stack is removed to form a second gate trench in the second dummy gate stack. As such, the gate dielectric layer of the second dummy gate stack may be re-exposed. The method 100 continues to operation 124 in which the second gate trench is refilled with a second conductive layer. In some embodiments, the second conductive layer may include two or more gate material layers stacked on top of one another, for example, an n-type work function layer, which is typically referred to as a n-metal, and one or more other conductive layers. The method 100 continues to operation 126 in which additional processing is performed to prepare the metal gate structures for electrical connection to other circuitry, and to electrically connect the metal gate structures to the other circuitry.

Figure 2A:
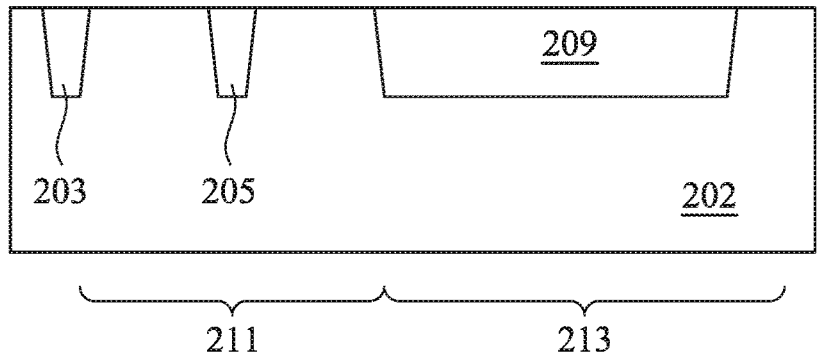
FIGS. 2A, 2B, 2C, 2D, 2E, 2F, 2G, 2H, 2I, 2J, 2K, 2L, 2M, 2N, and 2O illustrate cross-sectional views of an exemplary semiconductor device during various fabrication stages, made by the method of FIG. 1, in accordance with some embodiments.

As mentioned above, FIGS. 2A-2O illustrate, in a cross-sectional view, a portion of a semiconductor device 200, including a thin film resistor, at various fabrication stages of the method 100 of FIGS. 1A-1C. The semiconductor device 200 may be included in a microprocessor, memory cell, and/or another integrated circuit (IC). Also, FIGS. 2A-2O are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2O, for purposes of clarity of illustration.

Corresponding to operation 102 of FIG. 1A, FIG. 2A is a cross-sectional view of the semiconductor device 200 including a semiconductor substrate 202 at one of the various stages of fabrication, in accordance with some embodiments. As shown, when the semiconductor substrate 202 is provided, the semiconductor substrate 202 may include a plurality of isolation features (e.g., STI features) 203, 205, and 209 over a major surface of the semiconductor substrate 202. In some embodiments, between (e.g., surrounded by) the isolation features 203 and 205, a transistor region 211, where one or more MOSFETs are to be formed, may be defined; and the isolation feature 209 may define a resistor region 213, where one or more resistors are to be formed.

In some embodiments, the isolation features 203, 205, and 209 are formed using a chemical-mechanical planarization (CMP) or another process to polish the isolation features 203, 205, and 209 until the isolation features 203, 205, and 209 have a top surface substantially coplanar with a top surface of the semiconductor substrate 202. For example, after the CMP process the isolation features 203, 205, and 209 may have a top surface which may be about 25 A, about 25 A, or about 75 A above the top surface of the semiconductor substrate 202. In some embodiments, after the CMP process the isolation features 203, 205, and 209 may have a top surface which may be about 25 A, about 25 A, or about 75 A+/− about 200 A above the top surface of the semiconductor substrate 202.

In some embodiments, the semiconductor substrate 202 includes a silicon substrate. Alternatively, the semiconductor substrate 202 may include other elementary semiconductor material such as, for example, germanium. The semiconductor substrate 202 may also include a compound semiconductor such as silicon carbide, gallium arsenic, indium arsenide, and indium phosphide. The semiconductor substrate 202 may include an alloy semiconductor such as silicon germanium, silicon germanium carbide, gallium arsenic phosphide, and gallium indium phosphide. In one embodiment, the semiconductor substrate 202 includes an epitaxial layer. For example, the substrate may have an epitaxial layer overlying a bulk semiconductor. Furthermore, the semiconductor substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

Figure 2B:
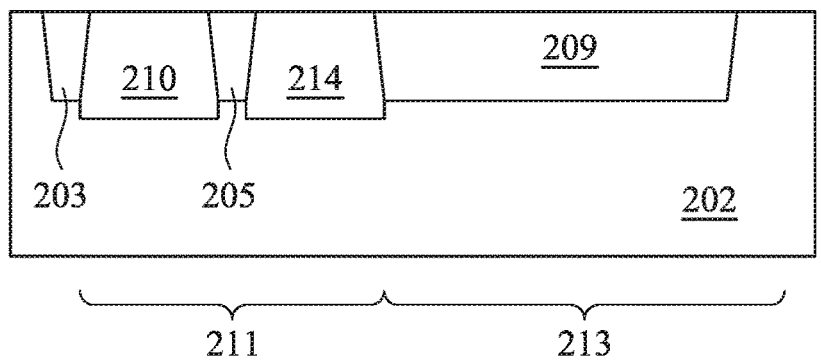

Corresponding to operation 103 of FIG. 1A, FIG. 2B is a cross-sectional view of the semiconductor device 200 including a first semiconductor well 210 and a second semiconductor well 214, which are respectively formed at one or more of the various stages of fabrication, in accordance with some embodiments. As shown, the first semiconductor well 210 is formed to be laterally between the isolation features 203 and 205 (i.e., within the transistor region 211), and vertically extend into the semiconductor substrate 202; and the second semiconductor well 214 is formed to be laterally between the isolation features 205 and 207 (i.e., within the transistor region 211), and vertically extend into the semiconductor substrate 202. In some embodiments, the first semiconductor well 210 is doped with a first doping type (e.g., n-type) of dopants, for example, phosphorous (P), arsenic (As), antimony (Sb), etc.; and the second semiconductor well 214 is doped with a second doping type of dopants, different from the first doping type (e.g., p-type). Exemplary p-type dopants include boron (B), gallium (Ga), aluminum (Al), etc.

In some embodiments, the first semiconductor well 210 may be first formed by performing a series of processes, and the second semiconductor well 214 may be then formed following the similar series of processes. For brevity, only the formation of the first semiconductor well 210 is herein discussed. In some embodiments, the first semiconductor well 210 may be formed by performing at least some of the following processes: forming a removable layer (e.g., a photoresist layer, a hardmask layer, etc.) 221 over the semiconductor substrate 202 to expose an area where the first semiconductor well 210 is intended to be formed; performing a doping process (e.g., an ion implantation process, a diffusion process, etc.) to incorporate a plurality of dopants with the first doping type (n-type) into the semiconductor substrate 202; removing the removable layer 221; and performing an optional annealing process to activate the incorporated dopants.

Figure 2C:
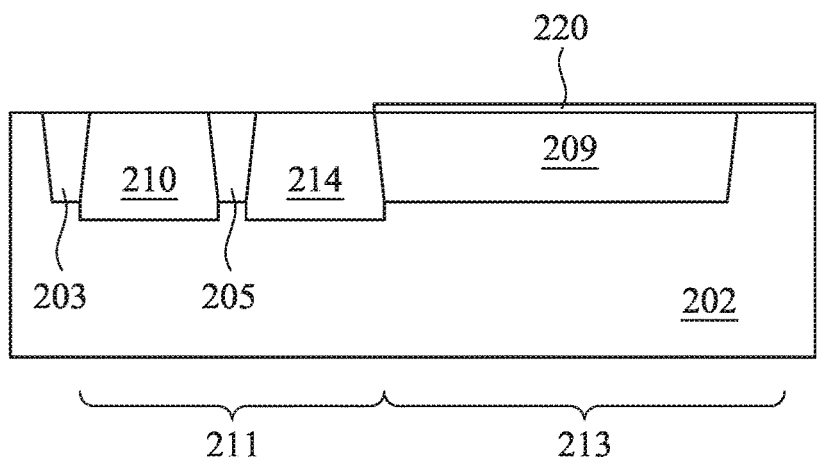

Corresponding to operation 104 of FIG. 1A, FIG. 2C is a cross-sectional view of the semiconductor device 200 including a protective layer 220, which is formed at one of the various stages of fabrication, in accordance with some embodiments. As shown, the protective layer 220 is formed over the resistor region 213. The protective layer 220 serves at least to protect the resistor region 213 (e.g. the STI of the resistor region 213) from being affected by further processing of subsequent stages of fabrication. In some embodiments, the protective layer 220 comprises one or more of a photoresist layer, a hardmask layer, an oxide layer, and another layer which may subsequently be removed, for example, without damaging other desired features of the semiconductor device 200 being formed.

Figure 2D:
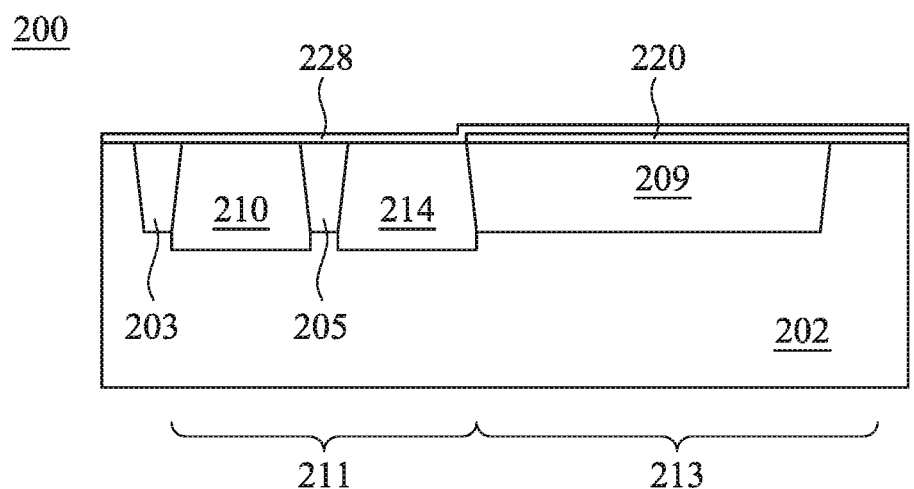

Corresponding to operation 105 of FIG. 1A, FIG. 2D is a cross-sectional view of the semiconductor device 200 including a gate dielectric layer 228, which is formed at one of the various stages of fabrication, in accordance with some embodiments. As shown, the gate dielectric layer 228 is disposed in the transistor region 211 above the first and second semiconductor wells 210 and 214, and is disposed in the resistor region 213 above the protective layer 220. Although in the illustrated embodiment of FIG. 2D (and the following figures), the gate dielectric layer 228 is shown as a single layer, it is understood that the gate dielectric layer 228 may include plural stacked layers on top of one another while remaining within the scope of the present disclosure.

In some embodiments, the gate dielectric layer 228 may be formed of a high-k dielectric material. Accordingly, the gate dielectric layer 228 includes a dielectric material having the dielectric constant higher than that of thermal silicon oxide, which is about 3.9. In one example, the gate dielectric layer 228 includes hafnium oxide (HfO). In various examples, the gate dielectric layer 228 includes metal oxide, metal nitride, or combinations thereof. In some embodiments, the gate dielectric layer 228 may be formed by using one of the following deposition techniques: chemical vapor deposition (CVD), physical vapor deposition (PVD), atomic layer deposition (ALD), spin-on coating, and/or other suitable metal material deposition techniques to deposit the above-described dielectric material, as shown in FIG. 2D. In one example, the gate dielectric layer 228 includes a thickness ranging between about 5 angstroms and about 100 angstroms.

Figure 2E:
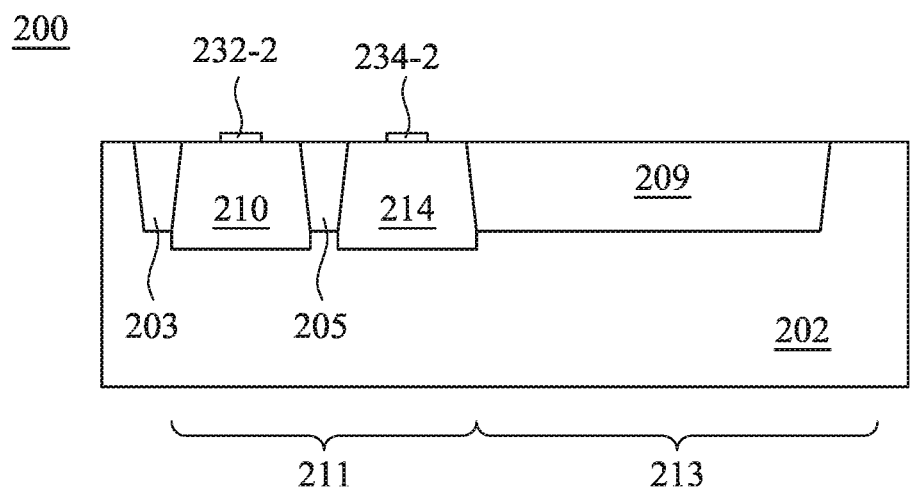

Corresponding to operation 106 of FIG. 1A, FIG. 2E is a cross-sectional view of the semiconductor device 200 including first and second gate dielectric layers 232-2 and 234-2 formed from the gate dielectric layer 228, which are formed at one of the various stages of fabrication, in accordance with some embodiments. As shown, the first and second gate dielectric layers 232-2 and 234-2 are respectively formed over the first and second semiconductor wells 210 and 214. The first and second gate dielectric layers 232-2 and 234-2 are formed, for example, by performing one or more dry and/or wet etching processes on the gate dielectric layer 228 (FIG. 2D) while using a removable layer (e.g., a photoresist layer, a hardmask layer, etc.) as a mask. Because of the protective layer 220, the STI region 209 is not affected by the etching process.

In addition, at operation 106, the protective layer 220 is also removed, for example, using a different dry and/or wet etching process than that used to etch the gate dielectric layer 228. In some embodiments, the etching process used to remove the protective layer 220 does not affect the STI region 209. In some embodiments, the etching process used does not substantially affect the STI region 209. For example, N-Methylpyrrolidone (NMP) or dimethyl sulfoxide (DMSO) may be used to remove the protective layer 220. In some embodiments, other etching processes and materials are used.

In some embodiments, after the protective layer 220 has been removed, the isolation feature 209 may have a top surface which may be less than about 5 nm below the top surface of the semiconductor substrate 202.

Figure 2F:
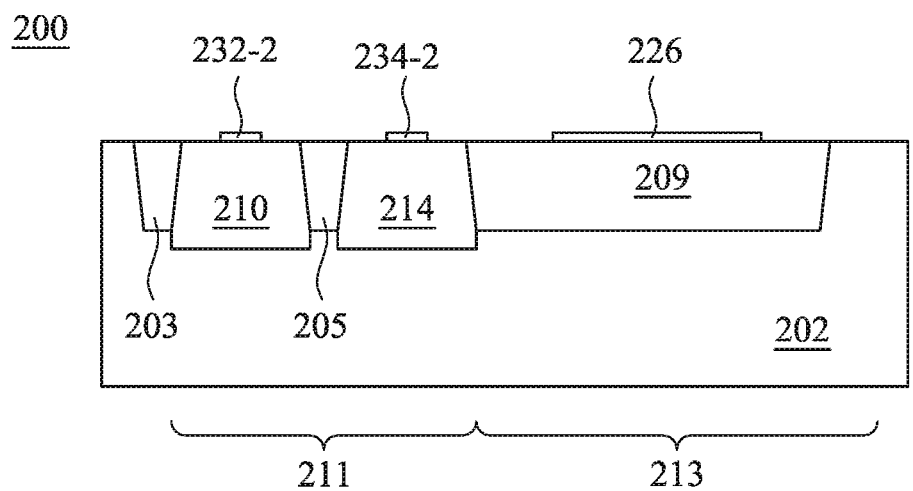

Corresponding to operation 108 of FIG. 1A, FIG. 2F is a cross-sectional view of the semiconductor device 200 including a metal thin film 226 as a resistor, which is formed at one of the various stages of fabrication, in accordance with some embodiments. As shown, the metal thin film 226 is disposed in the resistor region 213, and more specifically, above the STI of the resistor region 213.

In some embodiments, the metal thin film 226 is formed of a metal material that is selected from at least one of: tantalum (Ta), tantalum nitride (TaN), titanium (Ti), titanium nitride (TiN), tungsten (W), tungsten nitride (WN), nickel chromium (NiCr), silicon chromium (SiCr), and a combination thereof. In some embodiments, the metal thin film 226 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to deposit the above-described metal material on the semiconductor substrate 202 (in the resistor region 213). In one example, the metal thin film 226 includes a thickness ranging between about 5 angstrom and about 50 angstrom.

Figure 2G:
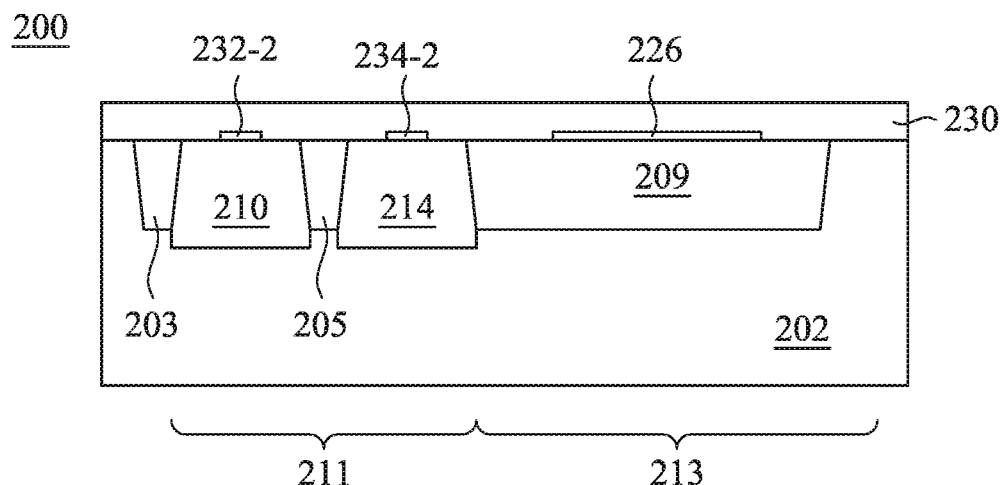

Corresponding to operation 110 of FIG. 1A, FIG. 2G is a cross-sectional view of the semiconductor device 200 including a dummy layer 230, which is formed at one of the various stages of fabrication, in accordance with some embodiments. As shown, the dummy layer 230 overlays both the transistor region 211 and the resistor region 213, in accordance with some embodiments. In some embodiments, the dummy layer 230 is formed of un-doped polysilicon. In some embodiments, the dummy layer 230 may be formed by using one of the following deposition techniques: chemical vapor deposition (CVD), physical vapor deposition (PVD), atomic layer deposition (ALD), spin-on coating, and/or other suitable deposition techniques to deposit the polysilicon to overlay the transistor region 211 and the resistor region 213.

Figure 2H:
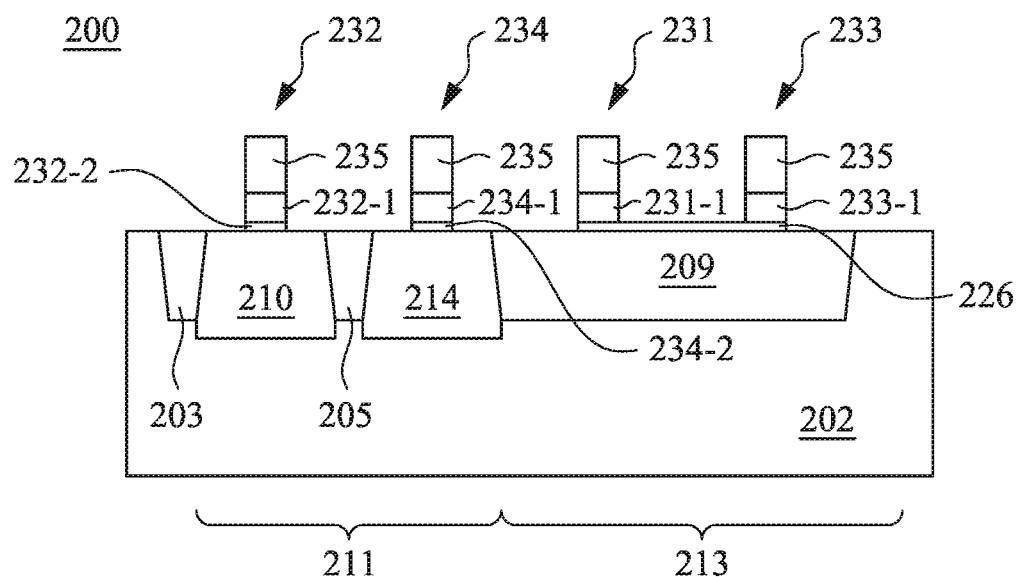

Corresponding to operation 112 of FIG. 1B, FIG. 2H is a cross-sectional view of the semiconductor device 200 including a first dummy gate stack 232 and a second dummy gate stack 234 over the transistor region, and a third dummy gate stack 231 and a fourth dummy gate stack 233 over the resistor region, which are formed at one of the various stages of fabrication, in accordance with some embodiments. In some embodiments, the first, second, third, and fourth dummy gate stacks 232, 234, 231, and 233 are formed by performing one or more dry/wet etching processes on the dummy layer 230 while using a removable layer (e.g., a photoresist layer, a hardmask layer, etc.) 235 as a mask.

As such, in some embodiments, the first dummy gate stack 232 is formed to include a first dummy portion 232-1, which was part of the dummy layer 230, and a first gate dielectric layer 232-2, which was part of the gate dielectric layer 228; the second dummy gate stack 234 includes a second dummy portion 234-1, which was part of the dummy layer 230, and a second gate dielectric layer 234-2, which was part of the gate dielectric layer 228; the third dummy gate stack 231 includes a third dummy portion 231-1 overlaying the metal thin film 226, which was part of the dummy layer 230; and the fourth dummy gate stack 233 includes a fourth dummy portion 233-1 overlaying the metal thin film 226, which was part of the dummy layer 230. Further, in some embodiments, the first dummy gate stack 232 is disposed at a substantially middle portion of the first semiconductor well 210 so as to expose respective side portions of the first semiconductor well 210; and the second dummy gate stack 234 is disposed at a substantially middle portion of the second semiconductor well 214 so as to expose respective side portions of the second semiconductor well 214.

Figure 2I:
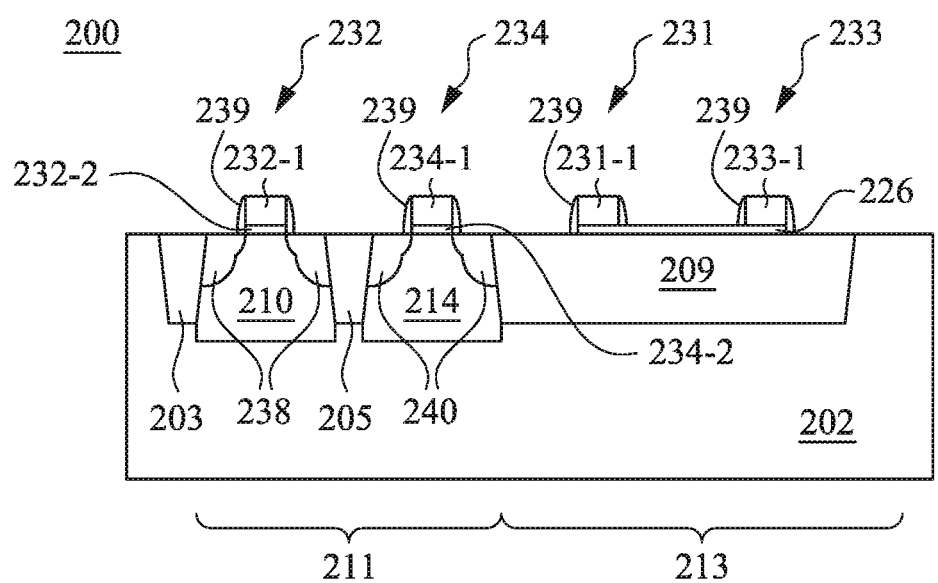

Corresponding to operation 114 of FIG. 1B, FIG. 2I is a cross-sectional view of the semiconductor device 200 including source/drain features 238 and source/drain features 240, which are formed at one of the various stages of fabrication, in accordance with some embodiments. As shown, the source/drain features 238 are formed in the first semiconductor well 210, and more specifically, the source/drain features 238 are laterally disposed at sides of the first dummy gate stack 232; and the source/drain features 240 are formed in the second semiconductor well 214, and more specifically, the source/drain features 240 are laterally disposed at sides of the second dummy gate stack 234. Further, in some embodiments, along respective sidewalls of the first, second, third, and fourth dummy gate stacks 232, 234, 231, and 233, dielectric spacers 239, which are optional, are formed. The dielectric spacers, may for example, allow lightly doped drain (LDD) features (not shown) to be formed in the source/drain features 238 and 240.

In some embodiments, the source/drain features 238, in the first semiconductor well 210, are doped with the second doping type of dopants (i.e., opposite to the first doping type of the first semiconductor well 210); and the source/drain features 240, in the second semiconductor well 214, are doped with the first doping type of dopants (i.e., opposite to the second doping type of the second semiconductor well 214). Moreover, the source/drain features 238 may be doped in an elevated doping concentration when compared to the first semiconductor well 210; and the source/drain features 240 may be doped in an elevated doping concentration when compared to the second semiconductor well 214. In some embodiments, the first semiconductor well 210, the first dummy portion 232-1 (which will be replaced by a p-metal gate), the first gate dielectric layer 232-2, and the source/drain features 238 may form a portion of a p-type MOSFET; and the second semiconductor well 214, the second dummy portion 234-1 (which will be replaced by a n-metal gate), the second gate dielectric layer 234-2, and the source/drain features 240 may form a portion of an n-type MOSFET, as will be discussed below.

In some embodiments, the source/drain features 238 and 240 may be formed by performing at least some of the following processes: forming a removable layer (e.g., a photoresist layer, a hardmask layer, etc.) over the semiconductor substrate 202 to expose an area where the source/drain features 238 or 240 are intended to be formed; performing a doping process (e.g., an ion implantation process, a diffusion process, etc.) to incorporate a plurality of dopants with the second doping type (p-type) or the first doping type (n-type) into the first semiconductor well 210 or the second semiconductor well 214; removing the removable layer; and performing an optional annealing process to activate the incorporated dopants.

Figure 2J:
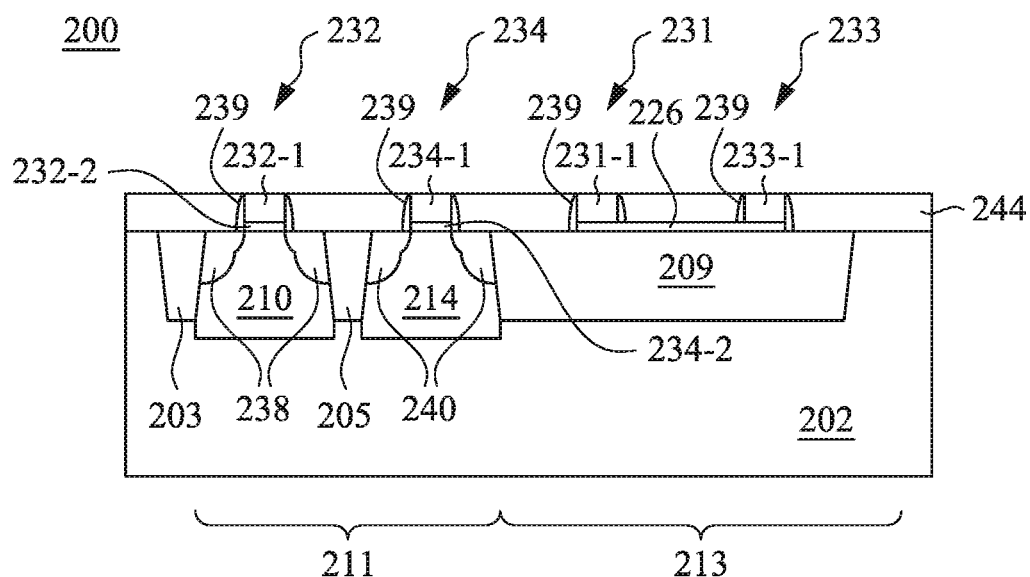

Corresponding to operation 116 of FIG. 1B, FIG. 2J is a cross-sectional view of the semiconductor device 200 including a dielectric layer 244, which is formed at one of the various stages of fabrication, in accordance with some embodiments. As shown, the dielectric layer 244 is formed over the semiconductor substrate 202, and, more specifically, to fill a space between and outside of the dummy gate stacks 232, 234, 231, and 233.

As mentioned above, the dielectric layer 244 may be an ILD layer that is configured to isolate conductive features disposed at respective different levels/tiers. In some embodiments, the dielectric layer 244 includes a material that is at least one of the following materials, including silicon oxide, a low dielectric constant (low-k) material, other suitable dielectric material, or a combination thereof. The low-k dielectric material may include fluorinated silica glass (FSG), phosphosilicate glass (PSG), borophosphosilicate glass (BPSG), carbon doped silicon oxide (SiOxCy), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the dielectric layer 244 may be formed by using one of the following deposition techniques: chemical vapor deposition (CVD), physical vapor deposition (PVD), atomic layer deposition (ALD), spin-on coating, and/or other suitable dielectric material deposition techniques to deposit the above-described dielectric material over the semiconductor substrate 202.

In some embodiments, the dielectric layer 244 is formed using a chemical-mechanical planarization (CMP) or another process to polish the dielectric layer 244 until the dielectric layer 244 has a top surface substantially coplanar with the first dummy portion 232-1, the second dummy portion 234-1, the third dummy portion 231-1, and the fourth dummy portion 233-1.

In some embodiments, after the CMP process, the third dummy portion 231-1 and the fourth dummy portion 233-1 may have a top surface which may be less than about 14 nm above the top surface of the dielectric layer 244.

Because the gate dielectric layer 228 is etched to form transistor gate oxides with a protective layer 220 covering the STI in the resistor region 213, the STI in the resistor region is protected from overetching. Consequently, the third and fourth dummy gate stacks 231 and 233 are not covered by dielectric layer 244 and remain exposed and can be removed to be replaced with a metal gate structure, for example, as discussed below. As a result, manufacturing yield loss due to malformed or unformed electrical connections are significantly decreased because of the successful formation of metal connection structures electrically connecting the metal thin film 226, as discussed below.

Figure 2K:
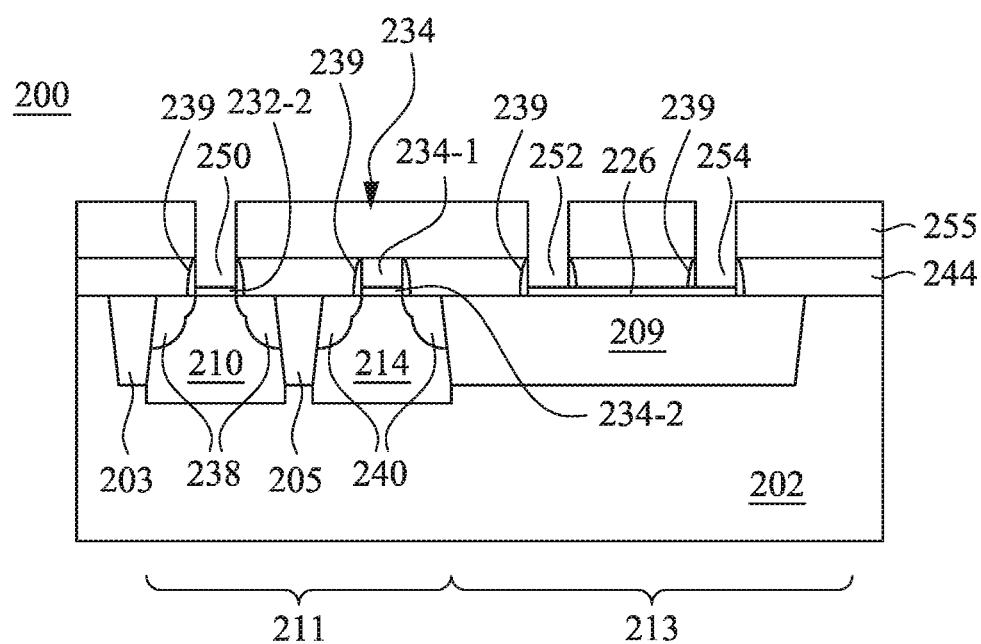

Corresponding to operation 118 of FIG. 1B, FIG. 2K is a cross-sectional view of the semiconductor device 200 including a first gate trench 250 (in the transistor region 211) and two contact holes 252 and 254 (in the resistor region 213), which are formed at one of the various stages of fabrication, in accordance with some embodiments. As shown, the first gate trench 250 is formed by removing the first dummy portion 232-1 of the first dummy gate stack 232; and the contact holes 252 and 254 are formed by removing the third and fourth dummy gate stacks 231 and 233. Accordingly, the first gate dielectric layer 232-2, and end portions of the metal thin film 226 are respectively re-exposed.

In some embodiments, the first gate trench 250 and the contact holes 252/254 may be concurrently formed by performing at least some of the following processes: forming a removable layer (e.g., a photoresist layer, a hardmask layer, etc.) 255 over the dielectric layer 244 to expose an area where the first gate trench 250 and the contact holes 252/254 are intended to be formed; performing one or more dry/wet etching processes to remove the first dummy portion 232-1, third dummy portion 231-1, and fourth dummy portion 233-1; removing the removable layer 255; and performing a cleaning process.

Figure 2L:
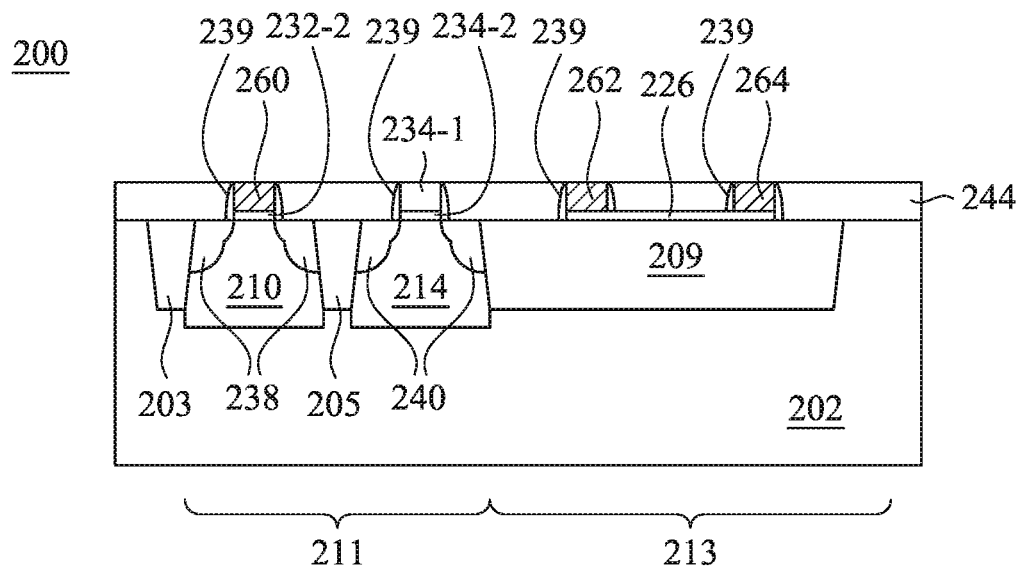

Corresponding to operation 120 of FIG. 1B, FIG. 2L is a cross-sectional view of the semiconductor device 200 including a plurality of metal features 260, 262, and 264, which are formed at one of the various stages of fabrication, in accordance with some embodiments. As shown, the metal features 260, 262, and 264 are formed by concurrently refilling the first gate trench 250 and the contact holes 252 and 254 with one or more conductive layers, which will be discussed below. In some embodiments, since the metal feature 260, together with the first semiconductor well 210, the first gate dielectric layer 232-2, and the source/drain features 238 may form a p-type MOSFET, and the metal feature 260 serves as the metal gate of the p-type MOSFET, the metal features 260/262/264 are herein referred to as p-type metal features.

Although in the illustrated embodiment of FIG. 2L (and the following figures), the p-type metal features 260/262/264 are each shown as a single layer, in some embodiments, the p-type metal features 260/262/264 may include two or more gate material layers (e.g., p- or n-type work function layers, conductive layers, etc.) stacked on top of one another. For example, the p-type metal features 260/262/264 each includes a p-type work function layer, which is typically referred to as a p-metal, and a conductive layer formed of a conductive material, e.g., aluminum (Al), overlaying the p-metal. In some embodiments, the p-metal has a work function of about or greater than about 5.2 eV. In one embodiment, the p-metal is formed of a conductive material selected from a group consisting of: titanium nitride (TiN), tantalum nitride (TaN), tungsten nitride (WN), and a combination thereof. In some embodiments, the p-type metal features 260/262/264 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to respectively overlay the gate trench 250 and the contact holes 252 and 254 with one or more of the above-described gate material layers.

In some embodiments, a conductive adhesive layer may be formed on the metal thin film 226 prior to forming the p-type metal features 260/262/264. The conductive adhesive layer may effectively adhere to both the metal thin film 226 and to the p-type metal features 262/264 formed thereon. In some embodiments, the conductive adhesive layer may include one or more conductive adhesive materials known to those in the art, and may be formed, for example, by using one of the following deposition techniques: chemical vapor deposition (CVD), physical vapor deposition (PVD), atomic layer deposition (ALD), spin-on coating, e-gun, sputtering, and/or other suitable conductive adhesive material deposition techniques.

Figure 2M:
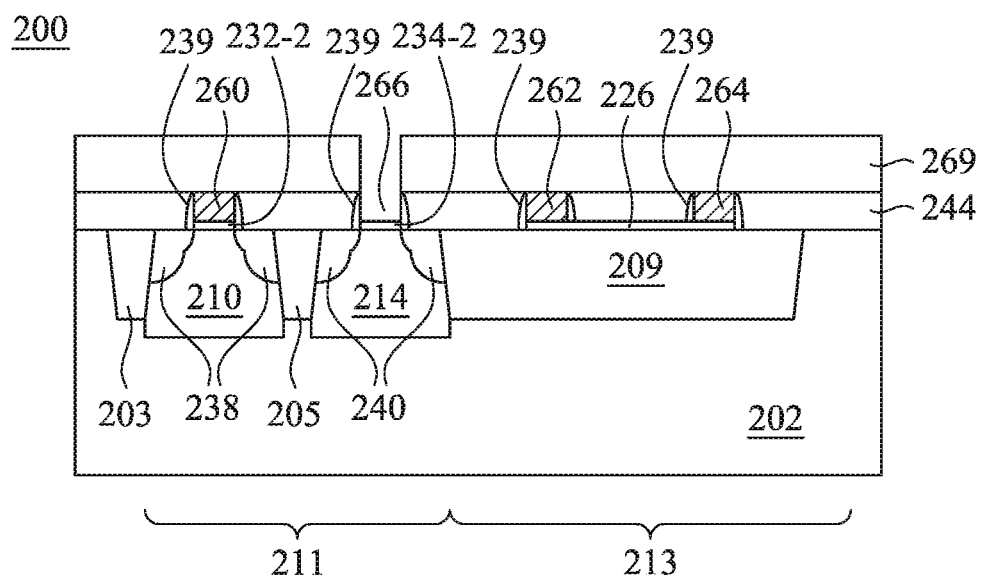

Corresponding to operation 122 of FIG. 1C, FIG. 2M is a cross-sectional view of the semiconductor device 200 including a second gate trench 266 (in the transistor region 211), which are formed at one of the various stages of fabrication, in accordance with some embodiments. As shown, the second gate trench 266 is formed by removing the second dummy portion 234-1 of the second dummy gate stack 234. Accordingly, the second gate dielectric layer 234-2 is exposed.

In some embodiments, the second gate trench 266 may be formed by performing at least some of the following processes: forming a removable layer (e.g., a photoresist layer, a hardmask layer, etc.) 269 over the dielectric layer 244 so as to expose an area where the second gate trench 266 is intended to be formed; performing one or more dry/wet etching processes to remove the second dummy portion 234-1; removing the removable layer 269; and performing a cleaning process.

Figure 2N:
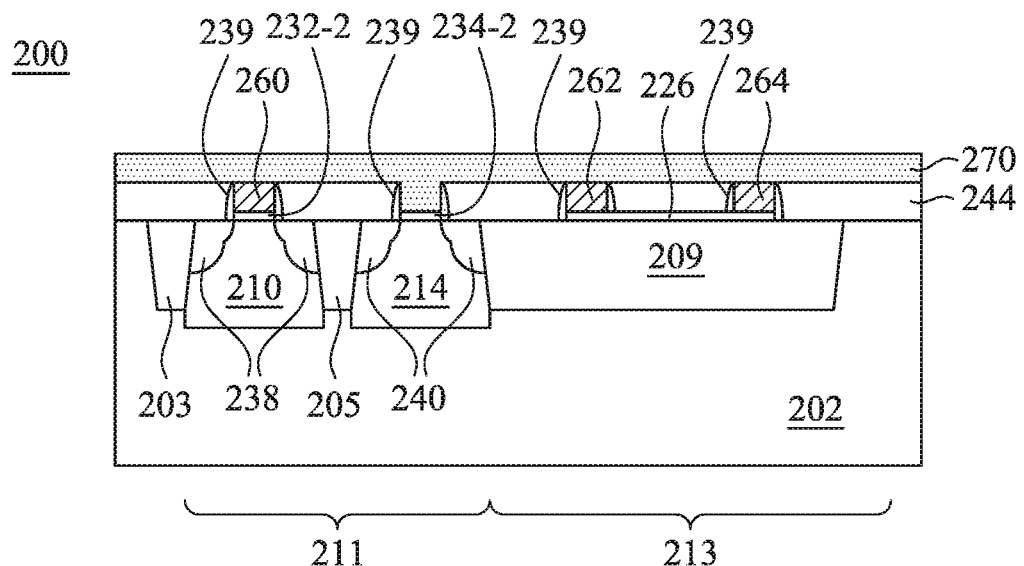
Figure 2O:
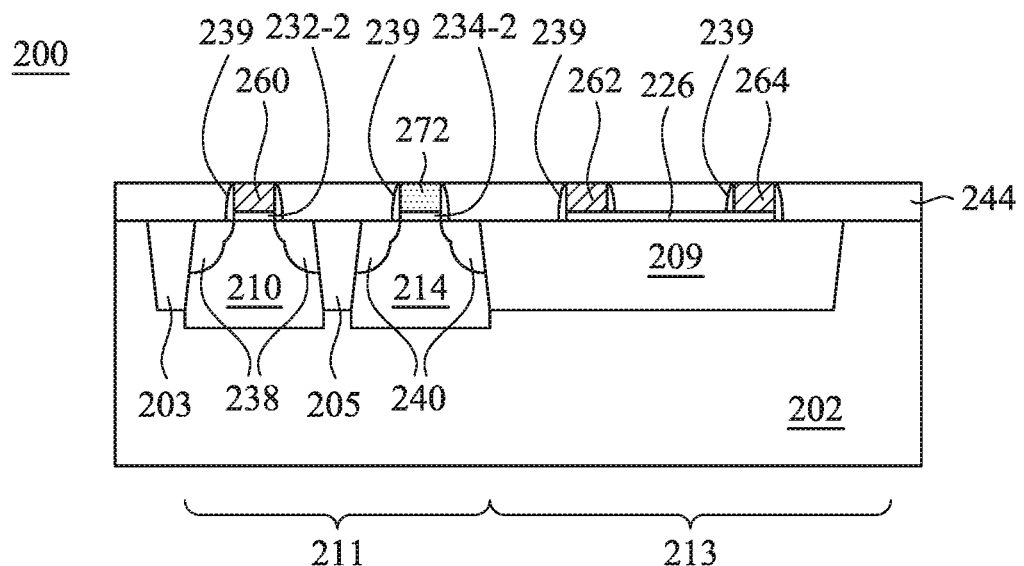

Corresponding to operation 124 of FIG. 1C, FIG. 2N is a cross-sectional view of the semiconductor device 200 including a conductive layer 270, which is formed at one of the various stages of fabrication, in accordance with some embodiments. As shown, the conductive layer 270 overlays a portion of the transistor region 211 and the resistor region 213 so as to refill the second gate trench 266.

Although in the illustrated embodiment of FIG. 2N (and the following figures), the conductive layer 270 is shown as a single layer, in some embodiments, the conductive layer 270 may include two or more gate material layers (e.g., p- or n-type work function layers, conductive layers, etc.) stacked on top of one another. For example, the conductive layer 270 includes an n-type work function layer, which is typically referred to as a n-metal, and a conductive layer formed of a conductive material, e.g., aluminum (Al), overlaying the n-metal. In some embodiments, the n-metal has a work function of about or less than about 4.2 eV. In one embodiment, the n-metal is formed of a conductive material selected from a group consisting of: tantalum (Ta), titanium aluminum (TiAl), titanium aluminum nitride (TiAlN), and a combination thereof. In some embodiments, the conductive layer 270 may be formed by using one of the following deposition techniques: chemical vapor deposition (CVD), physical vapor deposition (PVD), atomic layer deposition (ALD), spin-on coating, e-gun, sputtering, and/or other suitable metal material deposition techniques to respectively refill the second gate trench 266 with one or more of the above-described conductive materials.

Corresponding to operation 126 of FIG. 1C, FIG. 2O is a cross-sectional view of the semiconductor device 200 including a metal gate 272, which is formed at one of the various stages of fabrication, in accordance with some embodiments. In some embodiments, the metal gate 272 is formed by using the CMP process to polish the conductive layer 270 until the metal gate 272 has a top surface substantially coplanar with the metal gate 260. In some embodiments, such a top surface 275 may be also coplanar with respective top surfaces of other features, e.g., 244, 262, 264, etc. In some embodiments, since the metal gate 272, together with the second semiconductor well 214, the second gate dielectric layer 234-2, and the source/drain features 240, may form a portion of an n-type MOSFET, the metal gate 272 is herein referred to as an n-type metal gate 272.

Corresponding to operation 128 of FIG. 1C, although not shown, a plurality of contact plugs (e.g., tungsten contact plugs) may be formed within another low-k dielectric layer overlaying the polished coplanar top surface to electrically couple respective conductive features 238, 240, 260, 262, 264, and 272. As such, the p-type MOSFET, formed by the first semiconductor well 210, the p-type metal gate 260, the first gate dielectric layer 232-2, and the source/drain features 238, can be electrically coupled to one or more other electric components through the respective contact plugs; the n-type MOSFET, formed by the second semiconductor well 214, the n-type metal gate 272, the second gate dielectric layer 234-2, and the source/drain features 240, can be electrically coupled to one or more other electric components through the respective contact plugs; and the thin film resistor, formed by the metal thin film 226 and the contact structures 262 and 264, can be electrically coupled to one or more other electric components through the respective contact plugs.

Although the above-described contact structures 262 and 264 of the thin film resistor are formed concurrently with the gates of the p-type and n-type MOSFETs, it is understood that the contact structures 262 and 264 can be also formed subsequently to the formation of the gates of the p-type and n-type MOSFETs (e.g., in a back-end-of-line (BEOL) process) while remaining within the scoped of the present disclosure. Still further, although the above discussion is directed to concurrently forming the p-type metal features 260/262/264 and then forming the n-type metal gate 272, it is understood that the doping polarities of the metal features 260/262/264 and metal gate 272 can be switched while remaining within the scope of the present disclosure. That is, by using the disclosed method 100, "n-type" metal features 260/262/264 can be concurrently formed and then a "p-type" metal gate 272 can be formed.

Although the above-described metal thin film 226, and the contact structures 262 and 264 are formed on a single continuous STI structure 209. In alternative embodiments, a metal thin film extends from an STI structure across a portion of the semiconductor substrate without an STI structure and to another STI structure or another portion of the same STI structure, where contact structures are formed on the metal thin film over at least one of the STI structures.

As discussed in further detail above, because the gate oxide layers of the transistors are etched with a protective layer covering the STI in the resistor region, the STI in the resistor region is not overetched. Consequently, the third and fourth dummy gate stacks 231 and 233 are not covered by dielectric layer 244 and remain exposed and are removed to be replaced with a metal gate structure. As a result, manufacturing yield loss due to malformed or unformed electrical connections are significantly decreased because of the process features discussed herein.

One inventive aspect is a method of forming a semiconductor device. The method includes forming a plurality of isolation regions on a semiconductor substrate, forming a protective layer in a resistor region of the semiconductor substrate, after forming the protective layer, etching a gate dielectric layer to form first and second gate dielectric layers of a transistor in a transistor region of the semiconductor substrate, removing the protective layer, forming first and second dummy gate stacks over the first and second gate dielectric layers, respectively, forming a resistor in the resistor region, forming third and fourth dummy gate stacks over the resistor, and replacing each of the first, second, third, and fourth dummy gate stacks with a conductive material.

In some embodiments, the isolation regions are shallow trench isolation regions.

In some embodiments, the protective layer includes a photoresist layer.

In some embodiments, the gate dielectric layer includes a material having a dielectric constant greater than that of thermal silicon oxide.

In some embodiments, at least a portion of the first and second dummy gate stacks are formed at a same time as at least a portion of the third and fourth dummy gate stacks.

In some embodiments, at least a portion of the first and second dummy gate stacks are replaced at the same time as at least a portion of the third and fourth dummy gate stacks.

In some embodiments, replacing each of the third and fourth dummy gate stacks with the conductive material includes forming a conductive adhesive material on the resistor.

Another inventive aspect is a method of forming a semiconductor device. The method includes forming a plurality of first isolation regions in a transistor region of a semiconductor substrate, forming one or more second isolation regions in a resistor region of the semiconductor substrate, forming a gate dielectric layer in transistor region and the resistor region of the semiconductor substrate, and etching the gate dielectric layer to form first and second gate dielectric layers of a transistor in the transistor region of the semiconductor substrate, where the second isolation regions are prevented from being etched. The method also includes forming first and second dummy gate stacks in the transistor region, forming a resistor in the resistor region, forming third and fourth dummy gate stacks over the resistor, and replacing the first, second, third, and fourth dummy gate stacks with a conductive material.

In some embodiments, the first and second isolation regions are shallow trench isolation regions.

In some embodiments, the second isolation regions are prevented from being etched by a protective layer including a photoresist layer.

In some embodiments, the gate dielectric layer includes a material having a dielectric constant greater than that of thermal silicon oxide.

In some embodiments, at least a portion of the first and second dummy gate stacks are formed at the same time as at least a portion of the third and fourth dummy gate stacks.

In some embodiments, at least a portion of the first and second dummy gate stacks are replaced at the same time as at least a portion of the third and fourth dummy gate stacks.

In some embodiments, replacing each of the third and fourth dummy gate stacks with the conductive material includes forming a conductive adhesive material on the resistor.

Another inventive aspect is a method of forming a semiconductor device. The method includes forming a plurality of isolation regions on a semiconductor substrate, forming a resistor having a protective layer in a resistor region of the semiconductor substrate, after forming the resistor, etching a gate dielectric layer to form first and second gate dielectric layers of a transistor in a transistor region of the semiconductor substrate, forming first and second dummy gate stacks over the first and second gate dielectric layers, respectively, forming third and fourth dummy gate stacks over the resistor, and replacing each of the first, second, third, and fourth dummy gate stacks with a conductive material.

In some embodiments, the isolation regions are shallow trench isolation regions.

In some embodiments, the protective layer includes a photoresist layer.

In some embodiments, at least a portion of the first and second dummy gate stacks are formed at a same time as at least a portion of the third and fourth dummy gate stacks.

In some embodiments, at least a portion of the first and second dummy gate stacks are replaced at the same time as at least a portion of the third and fourth dummy gate stacks.

In some embodiments, replacing each of the third and fourth dummy gate stacks with the conductive material includes forming a conductive adhesive material on the resistor. The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a plurality of isolation regions on a semiconductor substrate;
   forming a protective layer in a resistor region of the semiconductor substrate;
   after forming the protective layer, etching a gate dielectric layer to form first and second gate dielectric layers of a transistor in a transistor region of the semiconductor substrate;
   removing the protective layer;
   forming first and second dummy gate stacks over the first and second gate dielectric layers, respectively;

forming a resistor in the resistor region;
forming third and fourth dummy gate stacks over the resistor; and
replacing each of the first, second, third, and fourth dummy gate stacks with a conductive material.

2. The method of claim 1, wherein the isolation regions are shallow trench isolation regions.

3. The method of claim 1, wherein the protective layer comprises a photoresist layer.

4. The method of claim 1, wherein the gate dielectric layer comprises a material having a dielectric constant greater than that of thermal silicon oxide.

5. The method of claim 1, wherein at least a portion of the first and second dummy gate stacks are formed at a same time as at least a portion of the third and fourth dummy gate stacks.

6. The method of claim 1, wherein at least a portion of the first and second dummy gate stacks are replaced at the same time as at least a portion of the third and fourth dummy gate stacks.

7. The method of claim 1, wherein replacing each of the third and fourth dummy gate stacks with the conductive material comprises forming a conductive adhesive material on the resistor.

8. A method of forming a semiconductor device, the method comprising:
   forming a plurality of first isolation regions in a transistor region of a semiconductor substrate;
   forming one or more second isolation regions in a resistor region of the semiconductor substrate;
   forming a gate dielectric layer in transistor region and the resistor region of the semiconductor substrate;
   etching the gate dielectric layer to form first and second gate dielectric layers of a transistor in the transistor region of the semiconductor substrate, wherein the second isolation regions are prevented from being etched;
   forming first and second dummy gate stacks in the transistor region;
   forming a resistor in the resistor region;
   forming third and fourth dummy gate stacks over the resistor; and
   replacing the first, second, third, and fourth dummy gate stacks with a conductive material.

9. The method of claim 8, wherein the first and second isolation regions are shallow trench isolation regions.

10. The method of claim 8, wherein the second isolation regions are prevented from being etched by a protective layer comprising a photoresist layer.

11. The method of claim 8, wherein the gate dielectric layer comprises a material having a dielectric constant greater than that of thermal silicon oxide.

12. The method of claim 8, wherein at least a portion of the first and second dummy gate stacks are formed at the same time as at least a portion of the third and fourth dummy gate stacks.

13. The method of claim 8, wherein at least a portion of the first and second dummy gate stacks are replaced at the same time as at least a portion of the third and fourth dummy gate stacks.

14. The method of claim 8, wherein replacing each of the third and fourth dummy gate stacks with the conductive material comprises forming a conductive adhesive material on the resistor.

15. A method of forming a semiconductor device, the method comprising:
   forming a plurality of isolation regions on a semiconductor substrate;
   forming a resistor having a protective layer in a resistor region of the semiconductor substrate;
   after forming the resistor, etching a gate dielectric layer to form first and second gate dielectric layers of a transistor in a transistor region of the semiconductor substrate;
   forming first and second dummy gate stacks over the first and second gate dielectric layers, respectively;
   forming third and fourth dummy gate stacks over the resistor; and
   replacing each of the first, second, third, and fourth dummy gate stacks with a conductive material.

16. The method of claim 15, wherein the isolation regions are shallow trench isolation regions.

17. The method of claim 15, wherein the protective layer comprises a photoresist layer.

18. The method of claim 15, wherein at least a portion of the first and second dummy gate stacks are formed at a same time as at least a portion of the third and fourth dummy gate stacks.

19. The method of claim 15, wherein at least a portion of the first and second dummy gate stacks are replaced at the same time as at least a portion of the third and fourth dummy gate stacks.

20. The method of claim 15, wherein replacing each of the third and fourth dummy gate stacks with the conductive material comprises forming a conductive adhesive material on the resistor.

* * * * *